United States Patent
Yoshida et al.

(10) Patent No.: US 8,385,379 B2
(45) Date of Patent: Feb. 26, 2013

(54) OPTICAL SEMICONDUCTOR DEVICE AND PUMPING LIGHT SOURCE FOR OPTICAL FIBER AMPLIFIER

(75) Inventors: Junji Yoshida, Tokyo (JP); Naoki Tsukiji, Tokyo (JP); Hidehiro Taniguchi, Tokyo (JP); Satoshi Irino, Tokyo (JP); Hirokazu Itoh, Tokyo (JP); Harunobu Ikeda, Tokyo (JP); Masako Kobayakawa, Tokyo (JP); Akihiko Kasukawa, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 308 days.

(21) Appl. No.: 12/683,676

(22) Filed: Jan. 7, 2010

(65) Prior Publication Data
US 2011/0164641 A1    Jul. 7, 2011

(51) Int. Cl.
    *H01S 5/00* (2006.01)
(52) U.S. Cl. ............... 372/45.011; 372/45.01; 372/50.1; 372/46.01; 372/46.016
(58) Field of Classification Search ............... 372/45.01, 372/45.011, 46.01–46.016, 50.1
See application file for complete search history.

(56) References Cited

U.S. PATENT DOCUMENTS

| 4,977,568 A * | 12/1990 | Yamamoto et al. ........ 372/46.01 |
| 2002/0105992 A1* | 8/2002 | Arakawa et al. ................ 372/50 |
| 2003/0133482 A1* | 7/2003 | Yoshida et al. ................. 372/43 |
| 2004/0086017 A1* | 5/2004 | Yoshida et al. ................. 372/46 |
| 2009/0252190 A1* | 10/2009 | Yoshimura et al. ........ 372/45.01 |

FOREIGN PATENT DOCUMENTS

| JP | 5-13869 | 1/1993 |
| JP | 5-75209 | 3/1993 |
| JP | 5-129723 | 5/1993 |
| JP | 8-127251 | 5/1996 |
| JP | 2008-198662 | 8/2008 |

* cited by examiner

*Primary Examiner* — Jessica Stultz
*Assistant Examiner* — Delma R Forde
(74) *Attorney, Agent, or Firm* — Turocy & Watson, LLP

(57) ABSTRACT

A semiconductor device of the invention is formed so that n-type InP current blocking layers enter the inside of p-type InP cladding layers, i.e., the n-type current blocking layers ride over the upper part of the p-type InP cladding layers, so that a distance between the n-type InP current block layers composing a current blocking region is narrower than a width of the p-type cladding layers contacting with the n-type InP current blocking layers. Thereby, the semiconductor device whose leak current in the current blocking region may be reduced which permits high-output and high-temperature operations may be readily fabricated.

14 Claims, 5 Drawing Sheets

1: n-type InP SUBSTRATE
2: n-type InP CLAD LAYER
3: GaInAsP ACTIVE LAYER
4: p-type InP CLAD LAYER
5: p-type InP CURRENT BLOCKING LAYER
6: n-type InP CURRENT BLOCKING LAYER
7: p-type InP CLAD LAYER
8: p-type GaInAsP CONTACT LAYER
9: n-SIDE ELECTRODE
10: p-SIDE ELECTRODE
12: p-GaInAsP CAP LAYER
13: ETCHING MASK

OPTICAL SEMICONDUCTOR DEVICE AND PUMPING LIGHT SOURCE FOR OPTICAL FIBER AMPLIFIER

BACKGROUND OF THE INVENTION

1. Field of the Invention

The present invention relates to an optical semiconductor device having a buried hetero-structure and to a pumping light source for optical fiber amplifier using the same.

2. Description of the Related Art

A current injection type semiconductor device adopts a structure having a current confinement function to efficiently inject current to an active layer, i.e., an emitting region. One of the current confinement structures uses a structure having buried current blocking regions on the both sides of a mesa-stripe containing the active layer. A structure including inversely biased pn junction is used in general as the current blocking region. It is noted that a difference of refractive indices is generated between the current blocking region and the active layer in the semiconductor device having such buried current blocking region, so that the semiconductor device has a horizontal optical waveguide function for confining generated light within the active layer. Due to this optical waveguide function, the shape of the generated light (laser beam) becomes substantially circular and the semiconductor device has an advantage that it may be coupled with an optical fiber with high coupling efficiency through an optical part such as a lens.

FIG. 5 is a diagrammatic view of a section of a known semiconductor device perpendicular to a direction of a resonator having a so-called buried hetero-structure (BH) having a current device blocking layer grown by metal-organic vapor phase epitaxy (MOVPE). In the semiconductor device shown in FIG. 5, a mesa-stripe is formed by an n-type InP cladding layer 2, a GaInAsP active layer 3 and a p-type InP cladding layer 4 on an n-type InP substrate 1 and the current blocking regions composed of a p-type InP current blocking layer 5 and an n-type InP current blocking layer 6 are formed on the both side surfaces of the mesa-stripe by means of buried growth. Further, a p-type InP cladding layer 7 and a p-type GaInAsP contact layer 8 are formed at predetermined position on the mesa-stripe and the current blocking regions. Then, an n-type electrode 9 is formed under the n-type InP substrate 1 and a p-type electrode 10 is formed on the contact layer 8 to inject electric current.

In the semiconductor device in FIG. 5, similarly to the pn double hetero junction including the GaInAsP active layer 3, forward bias is applied to the pn junction between the p-type InP current blocking layer 5 and the n-type InP cladding layer 2 when the semiconductor device is operative. Further, the p-type InP cladding layer 7, the n-type InP current blocking layer 6, the p-type InP current blocking layer 5 and the n-type InP substrate 1 compose a pnpn-type thyristor structure 11.

When plus voltage is applied to the p-side electrode 10 and minus voltage to the n-side electrode 9 in the semiconductor device having such structure, the most of the injected current is injected to the active layer 3 due to a difference of built-in voltage of the pn junction. However, because forward bias is applied in a path I-II in FIG. 5, a leak current is generated through the pn junction between the p-type InP current blocking layer 5 and the n-type InP cladding layer 2. This leak current turns out a gate current of the thyristor structure 11, so that a leak current flows through a path III-IV corresponding to an anode current. Heretofore, technologies aiming at reducing the leak current are disclosed in Patent Documents 1 through 5.

Patent Document 1: Japanese Patent Application Laid-open No. 2008-198662
Patent Document 2: Japanese Patent Application Laid-open No. Hei. 8-127251
Patent Document 3: Japanese Patent Application Laid-open No. Hei. 5-13869
Patent Document 4: Japanese Patent Application Laid-open No. Hei. 5-129723
Patent Document 5: Japanese Patent Application Laid-open No. Hei. 5-75209

However, the leak current generated in the current blocking region of the semiconductor device having the buried hetero (BH) structure may become a cause that induces an increase of threshold current, thermal saturation of light output and discontinuous point (kink) in the light-current output characteristics. The discontinuous point (kink) is problematic in particular because it remarkably drops high output and high temperature operations of the semiconductor device.

In view of the problems described above, the present invention aims at providing a semiconductor device whose leak current in a current blocking region is small and which is capable of performing high-output and high-temperature operations, without causing any trouble in a process for fabricating the semiconductor device.

SUMMARY OF THE INVENTION

In order to solve the problems described above and to achieve the purposes described above, an optical semiconductor device of the invention is characterized in that it includes: a mesa-stripe having a double hetero-structure containing an active layer interposed between a n-type cladding layer and a p-type cladding layer formed on a n-type substrate; and a current blocking region having pn junction and composed of one material on side surface portions of the mesa of the double hetero-structure; and is arranged such that a distance W1 between the n-type current blocking layers composing the current blocking region is narrower than a width W2 of the p-type cladding layer contacting with the n-type current blocking layer.

The semiconductor device of the invention is also characterized in that a difference W1−W2 between the distance W1 between the n-type current blocking layers and the width W2 of the p-type cladding layer contacting with the n-type current blocking layer is more than −0.5 μm and less than 0 μm.

The semiconductor device of the invention is also characterized in that concentration of p-type impurity of the p-type current blocking layer is in a range from $1 \times 10^{18}$ cm$^{-3}$ to $1.2 \times 10^{18}$ cm$^{-3}$.

The semiconductor device of the invention is also characterized in that a material composing the n-type substrate is InP.

The semiconductor device of the invention is also characterized in that the active layer has a quantum well structure or a strain super-lattice quantum well structure.

The semiconductor device of the invention is also characterized in that a width of the active layer is selected so as to meet a single-transverse mode operation across a light waveguide direction.

The semiconductor device of the invention is also characterized in that films having different reflectivity are formed on the both end surfaces in a resonator direction of the semiconductor device.

The semiconductor device of the invention is also characterized in that the active layer is composed of GaInAsP.

The semiconductor device of the invention is also characterized in that the active layer contains an active layer in which thickness of a well layer is 6 nm or more.

The semiconductor device of the invention is also characterized in that the active layer is composed of AlGaInAs.

A pumping light source for fiber amplifier whose fiber end light output is 400 mW or more is characterized in that it includes: the optical semiconductor device composed of the semiconductor device of the invention; a temperature controlling module for controlling temperature of the optical semiconductor device; an optical fiber for guiding laser light outputted out of the optical semiconductor device to the outside; and an optical coupling lens system for optically coupling the optical semiconductor device and the optical fiber.

The pumping light source for fiber amplifier is characterized in that it further includes an optical detector for measuring the light output of the optical semiconductor device and an isolator.

ADVANTAGES OF THE INVENTION

Because the optical semiconductor device of the invention is arranged such that the distance W1 between the n-type current blocking layers composing the current blocking region is narrower than the width W2 of the p-type cladding layer contacting with the n-type current blocking layer, the semiconductor device in which a contact region of the p-type cladding layer and the p-type current blocking layer is reduced and the anode current in the thyristor structure is reduced may be realized. Still more, the semiconductor device having the current blocking region by which current constrictivity is improved and by which turn-on current is hardly generated may be realized by reducing the anode current.

Further, because the semiconductor device of the invention is arranged such that the difference W1−W2 between the distance W1 between the n-type current blocking layers and the width W2 of the p-type cladding layer contacting with the n-type current blocking layer is more than −0.5 μm and less than 0 μm, it is possible to realize the highly reliable and high-output operable optical semiconductor device that is not influenced by thermal saturation of light output otherwise caused by an increase of device resistance due to diffusion of impurity in the p-type cladding layer generated in the fabrication process.

Further, because the semiconductor device of the invention is arranged such that concentration of p-type impurity of the p-type current blocking layer is in a range from $1 \times 10^{18}$ cm$^{-3}$ to $1.2 \times 10^{18}$ cm$^{-3}$, the anode current in the current device layer may be cut and absorption of light by the p-type impurity is cut. Therefore, it is possible to realize the optical semiconductor device capable of performing the high-output operations even when driven with high-current.

Further, because the semiconductor device of the invention is arranged such that the material composing the n-type substrate is InP, the optical semiconductor device most suitable for communication wavelength band may be realized with low threshold current and high efficiency.

Further, because the semiconductor device of the invention is arranged such that the active layer has the quantum well structure, the semiconductor device that highly efficiently operates with the low threshold current may be realized. Further, the active layer has the strain super-lattice quantum well structure, the semiconductor device that operates more highly efficiently with the low threshold current may be realized.

Further, because the semiconductor device of the invention is arranged such that the width of the active layer is selected so as to meet the single-transverse mode operation across the light waveguide direction, the optical semiconductor device capable of performing the high-output operation with the low threshold current that is most suitable for an optical communication system may be realized.

Further, because the semiconductor device of the invention is arranged such that the films having different reflectivity are formed on the both end surfaces in the resonator direction of the semiconductor device, light may be taken out efficiently from the end surface whose reflectivity is low. Still more, light from the end surface whose reflectivity is high may be received by a light receiving device to utilize the light as monitor light for controlling an output of the semiconductor device.

Further, because the semiconductor device of the invention is arranged such that the active layer is composed of GaInAsP, the optical semiconductor device capable of performing the high-output operation with the low threshold current that is most suitable for the optical communication system may be realized.

Further, because the semiconductor device of the invention is arranged such that the active layer contains an active layer in which thickness of a well layer is 6 nm or more, it is possible to realize the highly efficient optical semiconductor device which receives less influence of the short wavelength shift caused by a thermal process and whose threshold value is low.

Further, because the semiconductor device of the invention is arranged such that the active layer is composed of AlGaInAs, it is possible to realize the highly efficient optical semiconductor device in which the short wavelength shift caused by the thermal process is barely generated and whose threshold value is low.

Further, because a pumping light source for fiber amplifier whose fiber end light output is 400 mW or more may be realized by including: the semiconductor laser device composed of the semiconductor device of the invention described above; the temperature controlling module for controlling temperature of the optical semiconductor device; the optical fiber for guiding laser light output of the optical semiconductor device to the outside; and the optical coupling lens system for optically coupling the optical semiconductor device and the optical fiber, a fiber amplifier that supports a more large capacity optical communication system may be realized.

Further, because the fiber amplifier further including the optical detector for measuring the light output of the optical semiconductor device and the isolator may be realized, the large capacity communication system using the erbium doped fiber amplifier may be realized.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1A:
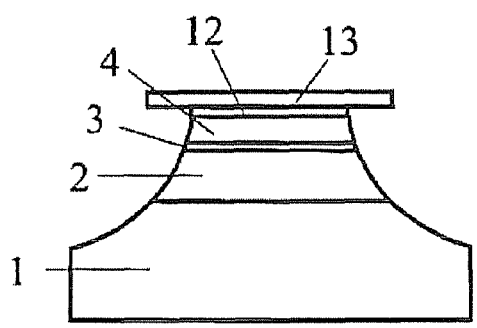
FIGS. 1A through 1C are diagrammatic section views showing processing steps for fabricating a semiconductor device according to an embodiment of the invention.

An embodiment of a semiconductor device of the present invention will be explained below with reference to the drawings. It is noted that the present invention is not limited by this embodiment. Still more, the same or corresponding components will be denoted by the same reference numerals throughout the drawings.

Figure 1B:
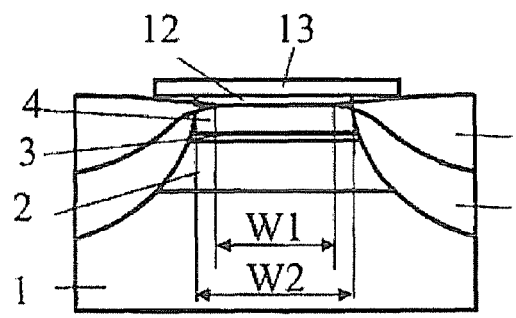
Figure 1C:
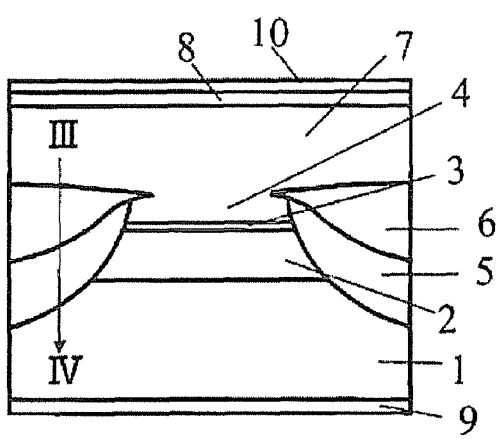

FIGS. 1A through 1C show processing steps for fabricating the semiconductor device in which current blocking layers composing current blocking regions are buried and grown on a n-type InP substrate by metal-organic vapor phase epitaxy according to the embodiment of the invention. It is noted that an n-type InP substrate in which sulfur (S) is doped as impurities and whose density of dislocation is small may be used to grow high-quality crystals on the n-type InP substrate.

As shown in FIG. 1A, an n-type InP cladding layer 2, a GaInAsP active layer 3, a p-type InP cladding layer 4 and a p-GaInAsP cap layer 12 are grown sequentially on the n-type InP substrate 1 and then an etching mask 13 composed of a $SiN_x$ dielectric film is formed on the p-GaInAsP cap layer 12 in stripe to form a mesa-stripe by means of wet-etching. A mesa having a curved surface by which no specific plane orientation appears may be formed in forming the mesa-stripe. Thereby, it becomes possible to realize a width of the active layer that satisfies a single-transverse mode with high control by controlling a width of the mesa right under the $SiN_x$ dielectric film while confirming by an optical microscope. It is noted that there is no problem even if the mesa-stripe is formed by combining the wet etching with dry etching.

Here, as a crystal growing method, molecular beam epitaxy (MBE) and chemical beam epitaxy (CBE) may be used beside the metal-organic vapor phase epitaxy. Still more, $SiO_2$ and the like may be used for the etching mask.

The GaInAsP active layer 3 may be composed of a multiple quantum well structure composed of five layers of GaInAsP compressive strain quantum well layer (thickness: 4 nm) of around 1% of lattice mismatching degree and GaInAsP barrier layer (thickness: 10 nm) whose composition wavelength is 1.2 μm and six layers of separate-confinement hetero-structure (SCH) layer composed of GaInAsP whose composition wavelength varies from 0.95 μm to 1.2 μm and whose each layer is 40 nm thick. Still more, when the lattice mismatching degree of the active layer is to be increased, a strain compensated structure in which net amount of strain of the quantum well layer is reduced by using GaInAsP having the lattice mismatching degree that causes tensile strain in the barrier layer may be used.

Next, by utilizing the characteristics of the metal-organic vapor phase epitaxy that no crystal is grown on the etching mask 13 composed of dielectrics, the current blocking regions composed of the p-type InP current blocking layer 5 and the n-type InP current blocking layer 6 are formed in the regions other than the upper surface of the mesa-stripe and the current blocking regions on the side surface of the mesa-stripe are grown so that they are almost leveled with the etching mask 13.

In the p-type InP current blocking layer 5, preferably zinc (Zn) is added as the p-type dopant by more than $0.8 \times 10^{18}$ $cm^{-3}$ and less than $1.4 \times 10^{18}$ $cm^{-3}$. When the concentration of zinc of the p-type InP current blocking layer 5 is less than $0.8 \times 10^{18}$ $cm^{-3}$, reactive current flowing from III to IV shown in FIG. 1C is generated during driven with high-current, reducing the light output. When the concentration of zinc exceeds $1.4 \times 10^{18}$ $cm^{-3}$ on the other hand, absorption of light distributed in the current blocking region increases, thus increasing oscillation threshold value and dropping the external quantum efficiency. It is essential to reduce the absorption of light in the current blocking region and is required to lower the p-type impurity concentration as much as possible to realize high-output operation like a semiconductor pumped laser. Accordingly, from an aspect of achieving the both reduction of the leak current in the current blocking region and the reduction of the absorption of light, the concentration of zinc in the p-type InP current blocking layer is preferable to be more than $1 \times 10^{18}$ $cm^{-3}$ and less than $1.2 \times 10^{18}$ $cm^{-3}$.

The n-type InP current blocking layer 6 enters the inside of the p-type InP cladding layer 4, i.e., the n-type InP current blocking layer 6 rides over the p-type InP cladding layer 4, so that a distance W1 between the n-type InP current blocking layers 6 composing the current blocking region is narrower than a width W2 between the p-type cladding layers 4 contacting with the n-type InP current blocking layer 6.

As a result of ardent study, the inventor et al. of the present invention found that the structure of the n-type InP current blocking layer 6 described above may be obtained by optimizing growth temperature of the current blocking region. This structure is considered to be obtained because the shape of part of the side surface of the mesa-stripe of the p-type InP cladding layer 4 and the p-GaInAsP cap layer 12 transforms due to a mass-transport phenomenon by which group III atoms are diffused in burying and growing the p-type InP current blocking layer 5 and the n-type InP current blocking layer 6 composing the current blocking region.

More specifically, the inventor et al. confirmed by experiments that this may be achieved with the growth temperature of 672° C. or more. This may be approximated by a linear function of temperature, as follows;

$$W1 - W2 (\mu m) = -0.0092 \times T + 6.18 \quad (1)$$

It is noted that T denotes the growth temperature and is temperature of a tray for mounting a wafer measured by a radiation thermometer. Accordingly, the higher the growth temperature T, the narrower the distance W1 than the distance W2 may be.

Although the smaller the difference W1−W2 between the distance W1 between the n-type InP current blocking layers 6 and the width W2 of the p-type InP cladding layer 4 contacting with the n-type InP current blocking layer 6, the lower the leak current may be, it is desirable to be −0.5 μm or more because the light output drops if it is too small. This is considered to occur because zinc (Zn) that is the impurity within the p-type cladding layer contacting with the n-type InP current blocking layer 6 is diffused due to heat in growing the current blocking layer, the Zn concentration within the p-type cladding layer is reduced, electric resistance of the device is increased and thermal saturation of the light output becomes dominant.

Accordingly, the difference W1−W2 is desirable to be more than −0.2 μm and less than 0 μm in order to suppress the saturation of light output by the thermal saturation and to realize high reliability. Still more another problem occurs as the distance W1 becomes narrow that a gain spectrum determining a laser oscillation state is shifted to the short wavelength side and oscillation wavelength is shortened.

Here, the shortwave shift of the emission wavelength means that there is a problem that it is difficult to realize a desirable wavelength, leading to a drop of manufacturing yield, when the growth temperature varies per manufacturing batch and when there is in-plane distribution in the substrate depending on the growth temperature in a process for fabricating a semiconductor laser device for example. Specifically, a difference between a gain wavelength and diffractive grating wavelength varies in a DFB laser having a diffractive grating near the active layer and a DBR laser having a diffractive grating in a light waveguide around the active layer, causing also another problem of characteristic degradation of an increase of a laser oscillation threshold value and a drop of efficiency. The shortwave shift is considered to be caused by different atoms diffused at the interface of a quantum well and a barrier layer composing the active layer due to the heat of the growth temperature in growing again on after the second growth when a plurality of times of crystal growing process is included in fabricating a laser and the like having the buried hetero structure. It is known that the short wavelength shift is generated when a GaInAsP material is used in particular by mutual diffusion of the different group V atoms, i.e., As atoms and P atoms.

Then, in order to have the effect of reducing the leak current flowing through the current blocking region and to reduce the influence of the short wavelength shift by the growth temperature of the current blocking layer, preferably the thickness of the well layer of the GaInAsP active layer 3 is set to be 6 nm or more. It is noted that the thicker the thickness of the well layer, the less the influence of the mutual diffusion of the group V becomes at the interface between the well layer and the barrier layer in principle. Then, while the inventor et al. verified this in the invention, it was experimentally verified that there is no difference in the amount of short wavelength shift when the thickness of the well layer is 6 nm or more. Still more, when a quantum well layer composed of around 1% of compressed strain superlattice is applied to the active layer, deterioration of crystal quality caused by faults due to lattice mismatching is concerned as the well layer is thickened. Accordingly, the thickness of the well layer is desirable to be 10 nm or less. It is noted that no short wavelength shift occurs when AlGaInAs is used as a material composing the active layer, instead of GaInAsP. This is considered because the mutual diffusion of As atoms and P atoms that is the cause the short wavelength shift occurs at the interface between the quantum well layer and the barrier layer since the group V atom composing the active layer is only As atom.

After the process shown in FIG. 1B, the etching mask 13 and the p-GaInAsP cap layer 12 are removed by etching and a p-type InP cladding layer 7 and a p-type GaInAsP contact layer 8 whose composition wavelength is 1.2 µm are grown by using the metal-organic vapor phase epitaxy as shown in FIG. 1C. Then, in order to adjust the thickness of the substrate, the under surface of the n-type InP substrate 1 (the surface on the opposite side from the surface on which the respective semiconductor layers are formed as described above) is thinned by polishing around to 130 µm of thickness and an n-side electrode 9 is formed under the n-type InP substrate 1 and a p-side electrode 10 is formed on the p-type GaInAsP contact layer 8 respectively as shown in FIG. 1C. It is noted that molecular beam epitaxy and chemical beam epitaxy may be used for the method for growing crystals in this process.

Figure 5:
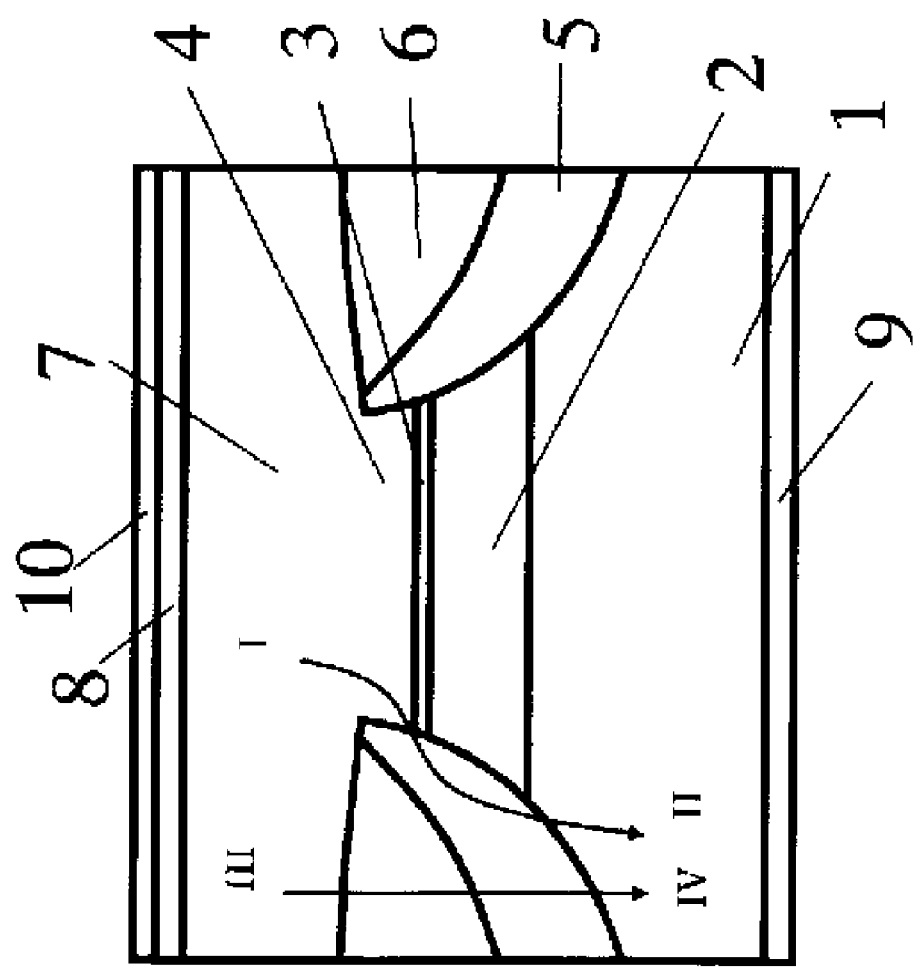
FIG. 5 is a diagrammatic section view showing a semiconductor device having a prior art structure.

The semiconductor device shown in FIG. 1C of the present embodiment fabricated as described above reduces the contact of the p-type InP current blocking layer 5 with the p-type InP cladding layer 7 in the mesa region as compared to the prior art semiconductor device shown in FIG. 5 by entering the part of the n-type InP current blocking layer 6 to the inside of 7. Due to that, the leak current otherwise flowing through the path I-II may be reduced.

Figure 4:
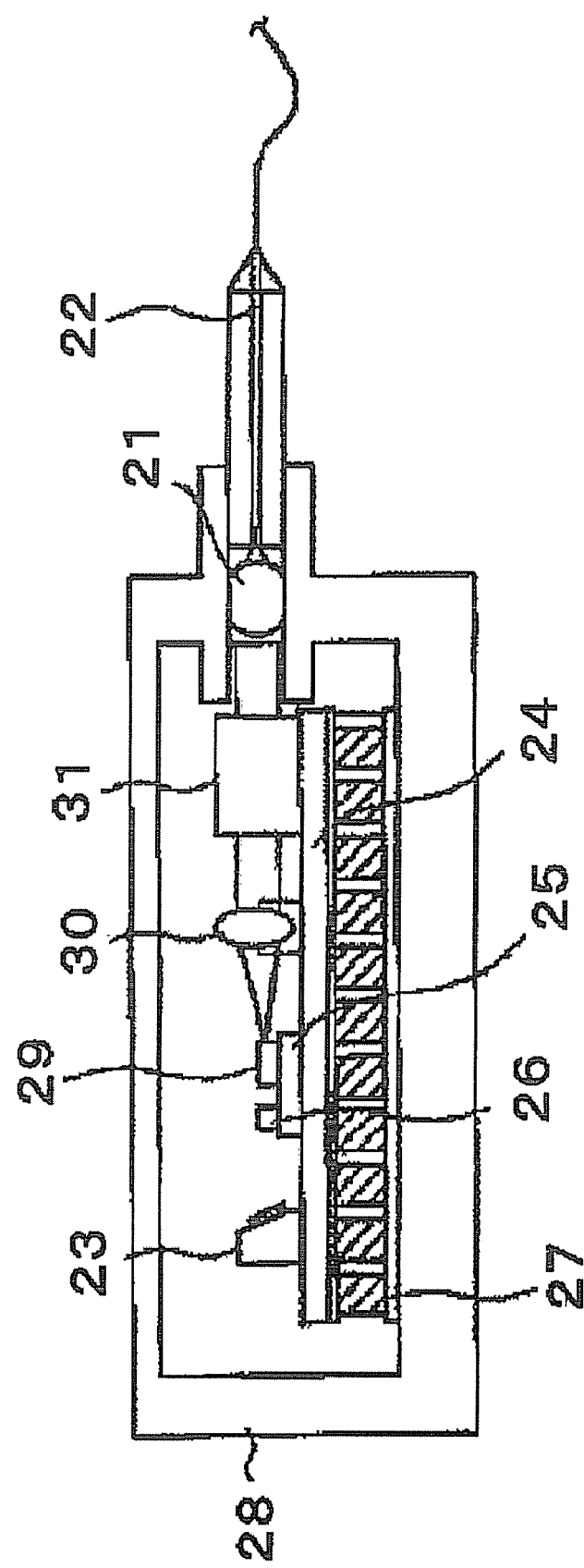
FIG. 4 is a side section view showing a laser module structure using the semiconductor device of the embodiment of the invention.

Next, a laser module assembled as a batter-fly package by using the semiconductor device of the invention will be explained. FIG. 4 is a side elevational section view showing a structure of the semiconductor laser module. A semiconductor laser device 29 constructed as junction-down structure in which a p-type electrode is junctioned to a laser mount 25. A temperature controlling module 27 is disposed as a temperature controller on the bottom of the inside of a package 28 formed of ceramics or the like as a case of the semiconductor laser module.

A base 24 is disposed on the temperature controlling module 27 and the laser mount 25 is disposed on the base 24. While electric current not shown is applied to the temperature controlling module 27 to cool or heat depending on its polarity, the temperature controlling module 27 functions mainly as a cooler to prevent oscillation wavelength drift caused by an increase of temperature of the semiconductor laser device 29. That is, when laser light has a wavelength longer than a desirable wavelength, the temperature controlling module 27 controls the temperature of the laser mount by cooling it down and when the laser light has a wavelength shorter than the desirable wavelength, controls the temperature by heating.

Specifically, this temperature is controlled based on a detected value of a thermistor 26 disposed in the vicinity of the semiconductor laser device 29 on the laser mount 25 and a controller not shown controls the temperature controlling module 27 so that the temperature of the laser mount 25 is kept constant. Further, the controller not shown controls the temperature controlling module 27 so that the temperature of the laser mount 25 drops as driving current of the semiconductor laser device 29 increases. The output stability of the semiconductor laser device 29 may be improved and the yield may be improved by performing the temperature control as described above. It is noted that the laser mount 25 is desirable to be formed by a material having a thermal conductivity such as diamond for example. It is because heat developed when high electrical current is applied may be suppressed when the laser mount 25 is formed of diamond.

Disposed on the base 24 are the laser mount 25 on which the semiconductor laser device 29 and the thermistor 26 are disposed, a first lens 30 and a light monitoring light receiving device 23. The laser light outputted out of the semiconductor laser device 29 is guided to an optical fiber 22 through the first lens 21, an isolator 31 and a second lens 21. The second lens 21 is provided on an optical axis of the laser light and on a package 28 and is optically coupled with the optical fiber 22. It is noted that the light monitoring light receiving device 23 monitors and detects light leaked from the high reflection film side of the semiconductor laser device 29.

The isolator 31 is interposed between the semiconductor laser device 29 and the optical fiber 22 so that no reflected return light reflected by other optical parts and the like returns to the resonator in this semiconductor laser module. It is noted that although the isolator whose extinction ratio is −20 dB is used here, it is preferable to use an isolator whose extinction ratio is less than −20 dB to suppress reflection from parts composing the system.

First Embodiment

An embodiment of the invention will be explained next. After forming the n-type InP cladding layer 2 of 1 um thick, the GaInAsP active layer 3 and the p-type InP cladding layer 4 of 0.5 μm thick and the p-GaInAsP cap layer 12 of 0.05 μm thick whose compositional wavelength is 1.2 μm thick sequentially on the n-type InP substrate 1 in which sulfur (S) is doped as impurity at 670° C., the etching mask 13 composed of the SiNx dielectric film is formed on the p-GaInAsP cap layer 12 of the stripe to form the mesa-stripe by using wet etching. In forming the mesa-stripe, the mesa is formed so as to have the curved shape by which no specific plane orientation appears. The GaInAsP active layer 3 is composed of the multiple quantum well structure composed of five layers of GaAsP compressed strain quantum well layer of 4 nm thick whose lattice mismatching degree is around 1% and a GaInAsP barrier layer of 10 nm thick whose compositional wavelength is 1.2 μm and six layers of multistage optical confinement layer composed of GaInAsP in which each layer is 40 nm thick whose compositional wavelength varies from 0.95 μm to 1.2 μm. The composition of the quantum well layer is determined so that the oscillation wavelength turns out 1480 nm.

Next, the current blocking regions composed of the p-type InP current blocking layer 5 of 0.9 μm thick to which $1 \times 10^{18}$ cm$^{-3}$ of zinc (Z) is doped and the n-type InP current blocking layer 6 to which $1 \times 10^{18}$ cm$^{-3}$ of sulfur (S) is doped are formed in the regions other than the upper surface of the mesa-stripe by using the etching mask 13 and the current blocking regions on the side surface portions of the mesa-stripe are grown so that they are substantially leveled with the etching mask 13. The growth temperature at this time was 694° C.

After that, the etching mask 13 and the p-GaInAsP cap layer 12 are removed by means of etching and the p-type InP cladding layer 7 and the p-type GaInAsP contact layer 8 whose composional wavelength is 1.2 μm are grown by about 3 μm by using the metal-organic vapor phase epitaxy under 670° C. of growth temperature. Then, the semiconductor device of the present embodiment is achieved by thinning the under surface of the n-type InP substrate 1 by polishing around to 130 μm and forming an n-side electrode 9 under the substrate 1 and an p-side electrode 10 on the upper surface of the p-type GaInAsP contact layer 8, respectively, as shown in FIG. 1C. As a result of observation of the distance W1 between the n-type InP current blocking layers 6 of this semiconductor and the width W2 of the p-type InP cladding layer 4 contacting with the n-type InP current blocking layer 6 by means of sectional SEM (scanning electron microscope), the distance W1 was narrower than the width W2 by 0.2 μm in the present embodiment.

In order to evaluate laser characteristics of the semiconductor device of the embodiment fabricated as described above, the wafer after forming electrodes is cleaved into a bar of 1500 μm of resonator length. Then, a dielectric reflection film of 1.5% of reflectivity was formed on one end surface thereof and a dielectric reflection film of 98% of reflectivity was formed on the other end surface. After that, the device was isolated into individual devices. It is noted that the resonator length here is 1500 μm, it is desirable to have resonator length of 1500 μm in order to suppress increases of radiation and of temperature of the active layer and to assure the reliability of the device. However, because the longer the resonator length, the lower the slope efficiency is, the both high output and high reliability may be realized by reducing the internal loss of the laser and by optimizing the reflectivity of the output end surface of the laser light.

In order to realize higher output characteristics, it is effective to minimize a difference of between the refractive index of InP and equivalent refractive index of the laminate structure composing the laser and to widen a cutoff width of single-transverse mode. In order to realize this, the cutoff width may be widened to 5 μm or more by adopting the n-type cladding layer composed of GaInAsP and having a thickness of 4 μm or more instead of the n-InP cladding layer adopted in the present embodiment.

It is noted that while the reflectivity of the reflection end surface of the laser light is 98%, the laser light from this end surface is utilized as a monitor light for stabilizing the output. Accordingly, while the reflectivity is determined corresponding to a system to be applied, there will be no problem in terms of characteristics if the reflectivity is 90% or more as a high-output laser device.

Figure 2:
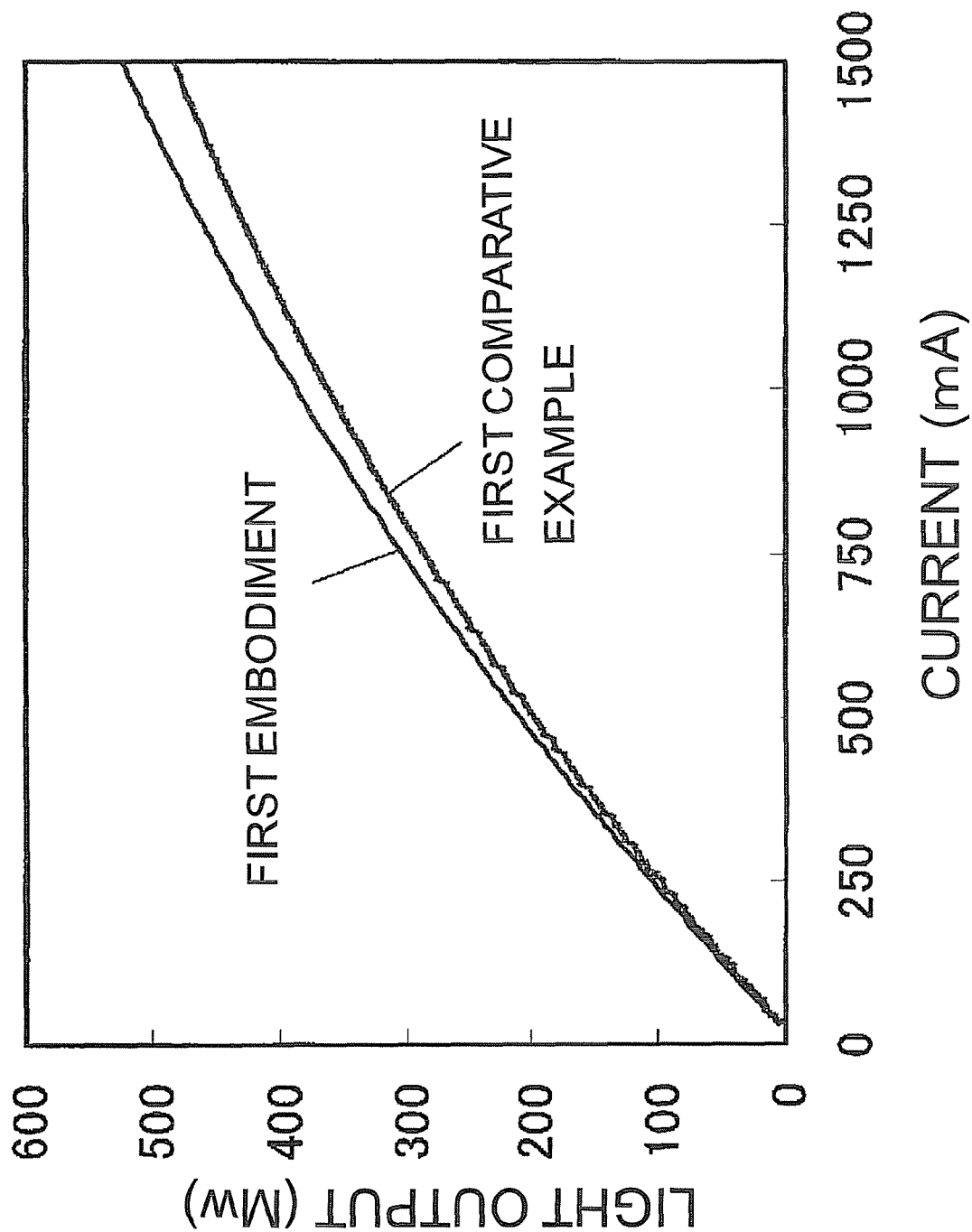
FIG. 2 is a graph showing light output-current characteristics of the semiconductor devices of the invention and of a comparative example.

Light output-current characteristics were measured as laser characteristics of the semiconductor device of the present embodiment. FIG. 2 shows its result. Still more, threshold current, slope efficiency in the vicinity of the threshold value and light output when driven by 1.5 A were measured. Table 1 shows its results.

First Comparative Example

In order to compare the laser characteristics of the semiconductor device of the invention, a semiconductor device having the prior art structure shown in FIG. 5 was fabricated as a first comparative example. It is noted that in order to compare the laser characteristics caused by the difference of the buried structure, the structures other than the buried shape, i.e., the laminate structure, resonator length, the reflectivity of the dielectric reflection film provided at the end face and others of the laser were made to be the same with those of the embodiment. As a result of sectional SEM observation of the distance W1 between the n-type InP current blocking layers 6 of the semiconductor device of the comparative example and the width W2 of the p-type InP cladding layer 4 contacting with the n-type InP current blocking layer 6, the distance W1 was wider than the width W2 by 0.4 μm. Similarly to the semiconductor device of the embodiment, light output-current characteristics, threshold current, slope efficiency in the vicinity of the threshold value and light output when driven by 1500 mA were measured as the laser characteristics also for the semiconductor device of the comparative example. Table 1 also shows its results.

From FIG. 2 and Table 1, it can be seen that the semiconductor device of the first embodiment realizes low threshold current, high slope efficiency and high-output operation as compared to the semiconductor device of the first comparative example.

TABLE 1

| | FIRST EMBODIMENT | COMPARATIVE EXAMPLE |
|---|---|---|
| THRESHOLD CURRENT (mA) | 29.3 | 32.5 |
| SLOPE EFFICIENCY (mW/mA) | 0.450 | 0.415 |
| LIGHT OUTPUT (when driven by 1.5 A) | 527.2 | 484.3 |

It is noted that when a semiconductor device in which only a width of the mesa-stripe is changed from the first embodiment was fabricated, it was confirmed that no discontinuous point (kink) is generated in the optical-current output characteristics in which the single-transverse mode is kept until the width of the mesa-stripe, i.e., the width of the active layer is 3 μm. It is noted that although the present embodiment adopts the straight mesa-stripe structure in which the width of the active layer is equal with respect to the light propagation direction, there is no problem even if a tapered stripe structure that keeps the single-transverse mode in which the width of the stripe varies with respect to the light propagation direction is adopted.

Still more, a semiconductor device of a second embodiment in which the distance W1 between the n-type InP current blocking layers 6 is narrower than the width W2 of the p-type InP cladding layer 4 contacting with the n-type InP current blocking layer 6 by 0.5 μm was obtained by forming the semiconductor device similarly to the semiconductor device of the first embodiment by raising the growth temperature in forming the current blocking layers to 730° C. Light output of the semiconductor device of the second embodiment was equal with that of the semiconductor device of the first embodiment. However, while a current value saturating the light output was 1700 mA in the first embodiment, it was 1500 mA in the second embodiment. It was considered to have occurred due to the diffusion of zinc in the p-type cladding layer increased in the second embodiment more than that of the first embodiment and due to the increased influence of thermal saturation of the light output due to the increase of resistance of the device by growing the current blocking layers at 730° C. of growth temperature.

As a result of mutual comparison of the characteristics of the modules composed of the semiconductor devices of the first embodiment and of the first comparative device, while the semiconductor device of the comparative example outputs 368 mW when operated with 1.5 A of direct current, the semiconductor device of the first embodiment outputs 400 mW. Accordingly, it was confirmed that the semiconductor device of the first embodiment is effective in the high-output operation also in the module. It was also confirmed that no kink is generated in the light output-current characteristics in a wide output range up to 400 mW after oscillating laser and that the semiconductor device of the first embodiment is effective as a pumping light source capable of amplifying from a less number of signals to a large number of signals. It was confirmed that the semiconductor device of the first embodiment operates in high-output as compared to the first comparative example also in a laser module with a fiber grading in which a diffractive grating is formed in part of the optical fiber in a structure not using the isolator as a pumping light source for Raman amplifier. The stability of wavelength was confirmed in the output up to 400 mW after oscillation of laser.

Semiconductor devices of third and fourth embodiments having the same growth conditions and structure with those of the first embodiment except of that layer thickness and a number of quantum well are set as shown in Table 2 were fabricated. A second comparative example shown in Table 2 has the active layer having the same structure with that of the first embodiment. It is noted that although the diffractive grating layer was composed of GaInAsP and was disposed between the GaInAsP active layer 3 and the p-type InP cladding layer 4 described above in the first embodiment, it may be formed also in the GaInAsP active layer 3.

Figure 3:
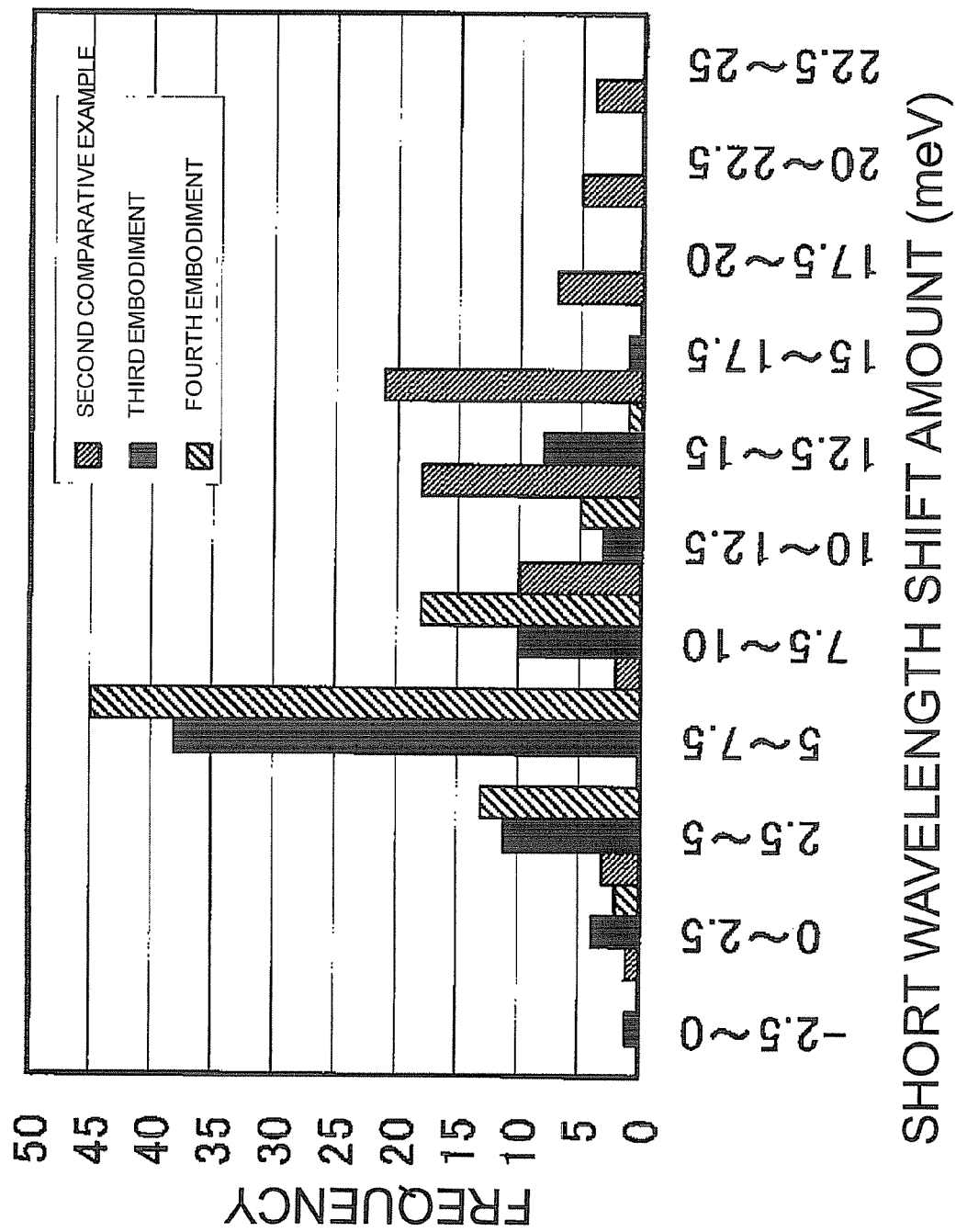
FIG. 3 is a graph showing histograms of short-wavelength shift amounts of the semiconductor devices of the embodiments of the invention and of the comparative example.

FIG. 3 shows results of histograms of a short-wavelength shift amount (=before forming current blocking layer-after forming current blocking layer) compared in the respective structures by means of photoluminescence measurement before and after forming the current blocking layer. It is noted that measuring spots were sampled from a 2-inch wafer and the short-wavelength shift amount was denoted by energy (meV). It is noted that Table 3 below indicates a number of measurements, median values and standard deviation of the respective structures.

TABLE 3

| | NUMBER OF MEASUREMENTS | MEDIAN VALUE (meV) | STANDARD DEVIATION (meV) |
|---|---|---|---|
| THIRD EMBODIMENT | 76 | 6.2 | 5.5 |
| FOURTH EMBODIMENT | 84 | 6.7 | 2.2 |
| SECOND COMPARATIVE EXAMPLE | 71 | 15.5 | 9.2 |

It can be seen from FIG. 3 that the short-wavelength shift amount of the both third and fourth embodiments is reduced and its distribution is small as compared to those of the second comparative example. From this point, it can be also seen that it is effective to thicken the layer thickness of the quantum well like the third and fourth embodiments to achieve the both reduction of the leak current of the current blocking layer and of the short-wavelength shift. Meanwhile, it can be also seen from Table 3 that the short-wavelength shift amount of the both structures A and B of the embodiments is reduced by about 9 meV and the standard deviation of the third and fourth embodiments is remarkably reduced as compared to the second comparative example as the thickness of the well layer is increased to 6 nm and 7 nm.

Still more, a dielectric multi-layer film having 0.1% of reflectivity was formed on the laser output end surface of the device and that having 98% of reflectivity was formed on the reflection end surface of the laser to implement characteristic evaluation of the laser (DFB laser). As a result, effects of reducing the threshold current and of improving the slope efficiency were confirmed in the third and fourth embodiments. Still more, while a yield of the semiconductor device whose threshold current is 9 mA or less and whose slope efficiency is 0.3 W/A or more was around 40% in the second comparative example, it was around 60% and was remarkably improved in the third and fourth embodiments. It can be seen from what described above that the embodiments of the invention not only suppress the short-wavelength shift amount but also are effective in improving the in-plane uni-

TABLE 2

| | LAYER THICKNESS OF QUANTUM WELL (nm) | NUMBER OF QUANTUM WELL | WAVELENGTH OF THE DIFFRACTIVE GRATING (nm) | RESONANCE WAVELENGTH (μm) |
|---|---|---|---|---|
| THIRD EMBODIMENT | 6 | 6 | 1550 | 300 |
| FOURTH EMBODIMENT | 7 | 5 | | |
| SECOND COMPARATIVE EXAMPLE | 4 | 8 | | | formity and bring about effects in improving the yield and lowering cost of the laser device.

It is noted that when a semiconductor device having the same structure and growth condition with those of the first embodiment (second comparative example) described above except of that the material composing the active layer is AlGaInAs was fabricated and when the short-wavelength shift amount was evaluated in the same manner with the third and fourth embodiments and the second comparative example by means of the photoluminescence measurement before and after forming the current blocking layer, a remarkable effect of suppressing the short-wavelength shift of around 1 meV was obtained in the semiconductor device as compared to the second comparative example of the second embodiment whose shift amount was 15.5 meV. Further, when characteristic evaluation of the laser (DFB laser) was carried out, while the characteristics were the same with the equal detuning amount, the same characteristics with the second comparative example was realized even in 95° C., while the second comparative example was operated only up to 85° C. It is noted that the detuning amount is defined by a difference between a wavelength of the diffractive grating and a peak wavelength of laser gain spectrum. Accordingly, it can be seen that introducing the AlGaInAs material into the active layer brings about the effects of not only suppressing the short-wavelength shift but also improving the high-temperature characteristics. It is noted that although the explanation was made by exemplifying the DFB laser here, it is needless to say that the same effect is brought about even in the pumping light source for optical fiber amplifier using AlGaInAs as the material of the active layer. Specifically, because it becomes possible to operate in high-temperature by using AlGaInAs as the material of the active layer more than the prior art active layer using the GaInAsP material, it becomes possible to obtain advantages that power consumption of the electronic cooler using a Peltier device may be cut by operating the device in high-temperature and that a highly reliable uncooled high-output laser may be realized in a communication wavelength band of 1200 to 1650 nm.

As described above, the semiconductor device of the invention has the advantages that it reduces the leak current flowing through the current blocking region and that enables one to realize the device that is less influence by the short wavelength shift due to the growth temperature of the current blocking layer. Therefore, the semiconductor device of the invention can realize the low threshold current and highly efficient and high-output operation. Still more, the invention has such advantages that it enables to realize the structure of the invention readily by the growth temperature of the current blocking region without complicated process in forming the mesa in growing the current blocking region.

Specifically, although the semiconductor device in which the material composing the active layer is GaInAsP has had a problem that the longer the oscillation wavelength generated from the semiconductor device, the harder the high-output operation becomes due to the Auger effect, the high-output semiconductor device of the invention is effective as a semiconductor device for the pumping light source for erbium doped fiber amplifier (EDFA) of 1460 nm or more and for the pumping light source for Raman amplifier that is required to output high-output of 300 mW or more. When compared with the equal light output in particular, the semiconductor device of the invention is advantageous in terms of high-reliability because it suppresses the increase of the temperature of the active layer by reducing the driving current. Further, the invention may realize the high-performance semiconductor device without increasing a number of processing steps as compared to that of the process for fabricating the semiconductor device having the prior art structure.

Still more, the pumping light source for the fiber amplifier described above has the structure in which the semiconductor device, the optical system such as a lens, the isolator and the output controlling monitor light receiving device are disposed on the electronic cooling system disposed within the n-type InP substrate 14-pin butterfly package and a light beam is coupled to the optical fiber through the optical system. Because it becomes possible to operate efficiently with the low threshold value as compared to the semiconductor device having the prior art structure by using the semiconductor device of the invention, the power consumption may be cut and that of the electronic cooling system may be cut. Still more, because the temperature of the active layer may be reduced, the semiconductor device of the invention has such an advantage that the long-term reliability of the laser module may be improved. Further, although intensity of excitation light to the fiber amplifier must be changed corresponding to a number of signals to be amplified when the semiconductor device is used in an optical communication system, the semiconductor device of the invention has such an effect that because it permits the high-output operation as compared to the prior art one, a number of signals to be amplified may be increased.

The dielectric reflection film of the invention may be formed by using chemical vapor deposition (CVD) and sputtering. It is noted that the dielectric film having 1.5% of reflectivity has been used as the dielectric reflection film having low reflectivity in the embodiments described above, it is preferable to use a dielectric multi-layered film having low reflectivity of 0.1% or less in a case of a semiconductor device having a complex resonator combined with an outside reflecting mirror to suppress Fabry-Perot resonance in the semiconductor device.

The material composing the active layer of the semiconductor device of the invention may be AlGaInAsP, GaInNAs and AlGaInN, instead of GaInAsP, and may be appropriately selected corresponding its use and purpose. Still more, the substrate (InP substrate, GaAs substrate, GaInAs substrate and the like) suitable for the respective materials may be appropriately used.

The active layer in the semiconductor device of the invention has the strain quantum well structure and may be accompanied by quantum dot, quantum wire and quantum dash structure. Still more, the optical confinement structure may be a single-stage SCH layer or a GRIN-SCH (Grated-Index Separate-Confinement Hetero-structure).

There is no problem even if the configuration of the semiconductor device of the invention to an optical function integrated device such as a modulator integrated laser and wavelength variable laser in which a plurality of functions are integrated on one and same substrate.

Although the invention has been described with respect to specific embodiments for a complete and clear disclosure, appended claims are not to be thus limited but are to be construed as embodying all modifications and alternative constructions that may occur to one skilled in the art that fairly fall within the basic teaching herein set forth.

What is claimed is:
1. An optical semiconductor device, comprising:
a semiconductor substrate;
a first cladding layer formed on one flat surface of said semiconductor substrate,
an active layer formed on said first cladding layer;
a second cladding layer formed on said active layer;

said first cladding layer, said active layer and said second cladding layer being formed as a mesa-shape structure, first current blocking layers of a first conductive type formed on said first cladding layer, said active layer and a part of said second cladding layer at both side surfaces of said mesa-shape structure; and second current blocking layers of a second conductive type formed as covering said first current blocking layers;

wherein upper surfaces of said second current blocking layers are same or substantially same as an upper surface of said second cladding layer, and said second current blocking layers are formed as films deposited at a deposition temperature T satisfying that the following formula is negative regarding said deposition temperature T of said second current blocking layer, and have a structure wherein end portions of said upper surfaces of said second current blocking layers extend over said first current blocking layer, and ride over said second cladding layer so as to enter the inside of said second cladding layer by the mass-transport phenomenon $$W1-W2\ (\mu m) = -0.0092 \times T + 6.18,$$

where,

W1 is a distance between said end portions of said second current blocking layers and W2 is a width between said first current blocking layers contacting said second cladding layer.

2. The optical semiconductor device according to claim 1, wherein the (W1−W2) satisfies −0.5 μm≦(W1−W2)<0 μm.

3. The optical semiconductor device according to claim 1, wherein concentration of said first conductive type impurity of said first current blocking layer is in a range from $0.8 \times 10^{18}$ cm$^{-3}$ to $1.4 \times 10^{18}$ cm$^{-3}$.

4. The optical semiconductor device according to claim 1, wherein a material composing said semiconductor substrate comprises InP.

5. The optical semiconductor device according to claim 4, wherein said active layer has a quantum well structure or a strain super-lattice quantum well structure.

6. The optical semiconductor device according to claim 5, wherein a width of said active layer is selected so as to meet a single-transverse mode operation across a light waveguide direction.

7. The optical semiconductor device according to claim 1, wherein films having different reflectivity are formed on the both end surfaces in a resonator direction of said optical semiconductor device.

8. The optical semiconductor device according to claim 5, wherein said active layer comprises GaInAsP.

9. The optical semiconductor device according to claim 6, wherein said active layer contains an active layer in which thickness of a well layer is 6 nm or more.

10. The optical semiconductor device according to claim 5, wherein said active layer comprises AlGaInAs.

11. A pumping light source for optical fiber amplifier, comprising:

a semiconductor laser device containing an optical semiconductor device, said optical semiconductor device comprising:

a semiconductor substrate;

a first cladding layer formed on one flat surface of said semiconductor substrate;

an active layer formed on said first cladding layer;

a second cladding layer formed on said active layer;

said first cladding layer, said active layer and said second cladding layer being formed as a mesa-shape structure, first current blocking layers of a first conductive type formed on said first cladding layer, said active layer and a part of said second cladding layer at both side surfaces of said mesa-shape structure; and second current blocking layers of a second conductive type formed as covering said first current blocking layers;

wherein upper surfaces of said second current blocking layers are same or substantially same as an upper surface of said second cladding layer, and said second current blocking layers are formed as films deposited at a deposition temperature T satisfying that the following formula is negative regarding said deposition temperature T of said second current blocking layer, and have a structure wherein end portions of said upper surfaces of said second current blocking layers extend over said first current blocking layer, and ride over said second cladding layer so as to enter the inside of said second cladding layer by the mass-transport phenomenon $$W1-W2\ (\mu m) = -0.0092 \times T + 6.18,$$

where,

W1 is a distance between said end portions of said second current blocking layers and W2 is a width between said first current blocking layers contacting said second cladding layer, an optical detector for measuring the light output from said semiconductor laser device;

an isolator;

a temperature controlling module for controlling a temperature of said semiconductor laser device to keep the temperature thereof at a desired temperature according to the light output measured by said optical detector;

an optical fiber for guiding laser light output from said semiconductor laser device to the outside; and an optical coupling lens system for optically coupling said semiconductor laser device and said optical fiber.

12. The pumping light source for fiber amplifier according to claim 11, wherein a light output from the optical fiber is 400 mW or more.

13. The optical semiconductor device according to claim 1, wherein said first current blocking layers and said second current blocking layers establish pn junction or np junction.

14. A method of producing an optical semiconductor device, comprising the steps of:

preparing a semiconductor substrate, forming a first cladding layer on one flat surface of said semiconductor substrate, forming an active layer on said first cladding layer, forming a second cladding layer on said active layer;

forming said first cladding layer, said active layer and said second cladding layer as a mesa-shape structure, forming first current blocking layers of a first conductive type on said first cladding layer, said active layer and a part of said second cladding layer at both side surfaces of said mesa-shape structure, forming second current blocking layers of a second conductive type as covering said first current blocking layers;

wherein in the step of forming said second current blocking layers, said second current blocking layers are formed so that upper surfaces of said second current blocking layers are same or substantially same as an upper surface of said second cladding layer, and said second current blocking layers are formed as films deposited at a deposition temperature T satisfying that the following formula is negative regarding said deposition temperature T of said second current blocking layer, and have a structure wherein end portions of said upper surfaces of said second current blocking layers extend over said first current blocking layer, and ride over said second cladding layer so as to enter the inside of said second cladding layer by the mass-transport phenomenon $$W1-W2 \, (\mu m) = -0.0092 \times T + 6.18,$$

where,

W1 is a distance between said end portions of said second current blocking layers and W2 is a width between said first current blocking layers contacting said second cladding layer.

* * * * *